United States Patent
Wang et al.

(10) Patent No.: US 7,592,870 B2
(45) Date of Patent: Sep. 22, 2009

(54) LOW NOISE, LOW POWER, HIGH LINEARITY DIFFERENTIAL AMPLIFIER WITH A CAPACITIVE INPUT IMPEDANCE

(75) Inventors: Dejun Wang, Irvine, CA (US); Hassan Elwan, Lake Forest, CA (US)

(73) Assignee: Newport Media, Inc., Lake Forest, CA (US)

( * ) Notice: Subject to any disclaimer, the term of this patent is extended or adjusted under 35 U.S.C. 154(b) by 59 days.

(21) Appl. No.: 11/837,638

(22) Filed: Aug. 13, 2007

(65) Prior Publication Data

US 2009/0045876 A1    Feb. 19, 2009

(51) Int. Cl.
*H03F 3/45*    (2006.01)
(52) U.S. Cl. .......................... 330/258; 330/260
(58) Field of Classification Search .......... 330/258–260
See application file for complete search history.

(56) References Cited

U.S. PATENT DOCUMENTS

| | | | | | |
|---|---|---|---|---|---|
| 4,553,108 | A | * | 11/1985 | Young | 330/300 |
| 4,888,562 | A | * | 12/1989 | Edler | 330/291 |
| 5,025,226 | A | * | 6/1991 | Taylor | 330/277 |
| 5,083,095 | A | * | 1/1992 | Madaffari | 330/277 |
| 5,352,992 | A | * | 10/1994 | Asazawa | 330/310 |
| 5,399,989 | A | * | 3/1995 | Chern | 330/254 |
| 6,023,194 | A | * | 2/2000 | Madaffari | 330/277 |
| 6,118,340 | A | | 9/2000 | Koen | |
| 6,175,279 | B1 | * | 1/2001 | Ciccarelli et al. | 330/296 |
| 6,600,371 | B2 | * | 7/2003 | Cali | 330/254 |
| 6,990,327 | B2 | * | 1/2006 | Zheng et al. | 455/307 |
| 7,030,701 | B2 | * | 4/2006 | Jung et al. | 330/308 |
| 7,057,457 | B2 | * | 6/2006 | Irvine et al. | 330/252 |
| 7,139,544 | B2 | * | 11/2006 | Smith et al. | 455/307 |
| 7,221,924 | B2 | * | 5/2007 | Zheng et al. | 455/307 |
| 7,292,104 | B1 | * | 11/2007 | Liwinski | 330/283 |
| 7,386,075 | B2 | * | 6/2008 | Mostov et al. | 375/345 |
| 7,423,489 | B2 | * | 9/2008 | Zhan et al. | 330/294 |
| 2003/0232609 | A1 | | 12/2003 | Yates | |
| 2005/0140443 | A1 | | 6/2005 | Joos et al. | |

FOREIGN PATENT DOCUMENTS

EP    0064126    11/1982

\* cited by examiner

*Primary Examiner*—Khanh V Nguyen
(74) *Attorney, Agent, or Firm*—Rahman LLC

(57) ABSTRACT

A low noise, low power differential two-stage amplifier includes a first stage comprising a pair of electrical devices that sense an input signal difference across the pair of electrical devices; and a control feedback loop operatively connected to the first stage, wherein the first stage in combination with the control loop feedback is adapted to place an exact copy of the signal across a first pair of resistive components, wherein the first pair of resistive components are adapted to generate a differential signal current, wherein the control feedback loop is adapted to ensure that the differential signal current goes a second pair of resistive components to generate a voltage output. Preferably, the first and second pair of resistive components are in ratio to produce the exact copy of the signal with some gain at an output of the first stage.

20 Claims, 15 Drawing Sheets

$Zip=Zin=Zi/2$, $Zfp=Zfn=Zf/2$
$V(Outp)-V(Outn)=(1+Zf/Zi)*(V(Inp)-V(Inn))$ $Zip=Zin=Zi/2, Zfp=Zfn=Zf/2$
$V(Outp)-V(Outn)=(1+Zf/Zi)*(V(Inp)-V(Inn))$ $Zip=Zin=Zi/2$, $Zfp=Zfn=Zf/2$
$V(Outp)-V(Outn)=(1+Zf/Zi)*(V(Inp)-V(Inn))$ $Zip = Zin = Zi/2$, $Zfp = Zfn = Zf/2$
$V(Outp) - V(Outn) = (1 + Zf/Zi) \cdot (V(Inp) - V(Inn))$ $Zip=Zin=Zi/2$, $Zfp=Zfn=Zf/2$
$V(Outp)-V(Outn)=(1+Zf/Zi)*(V(Inp)-V(Inn))$ $Zip=Zin=Zi/2$, $Zfp=Zfn=Zf/2$
$V(Outp)-V(Outn)=(1+Zf/Zi)*(V(Inp)-V(Inn))$ $Zip=Zin=Zi/2$, $Zfp=Zfn=Zf/2$
$V(Outp)-V(Outn)=(1+Zf/Zi)*(V(Inp)-V(Inn))$ $Zip = Zin = Zi/2, Zfp = Zfn = Zf/2$
$V(Outp) - V(Outn) = (1 + Zf/Zi) * (V(Inp) - V(Inn))$ $Zip=Zin=Zi/2, Zfp=Zfn=Zf/2$
$V(Outp)-V(Outn)=(1+Zf/Zi)*(V(Inp)-V(Inn))$ Zip=Zin=Zi/2, Zfp=Zfn=Zf/2
V(Outp)-V(Outn)=(1+Zf/Zi)*(V(Inp)-V(Inn))

$Zip=Zin=Zi/2$, $Zfp=Zfn=Zf/2$
$V(Outp)-V(Outn)=(1+Zf/Zi)*(V(Inp)-V(Inn))$

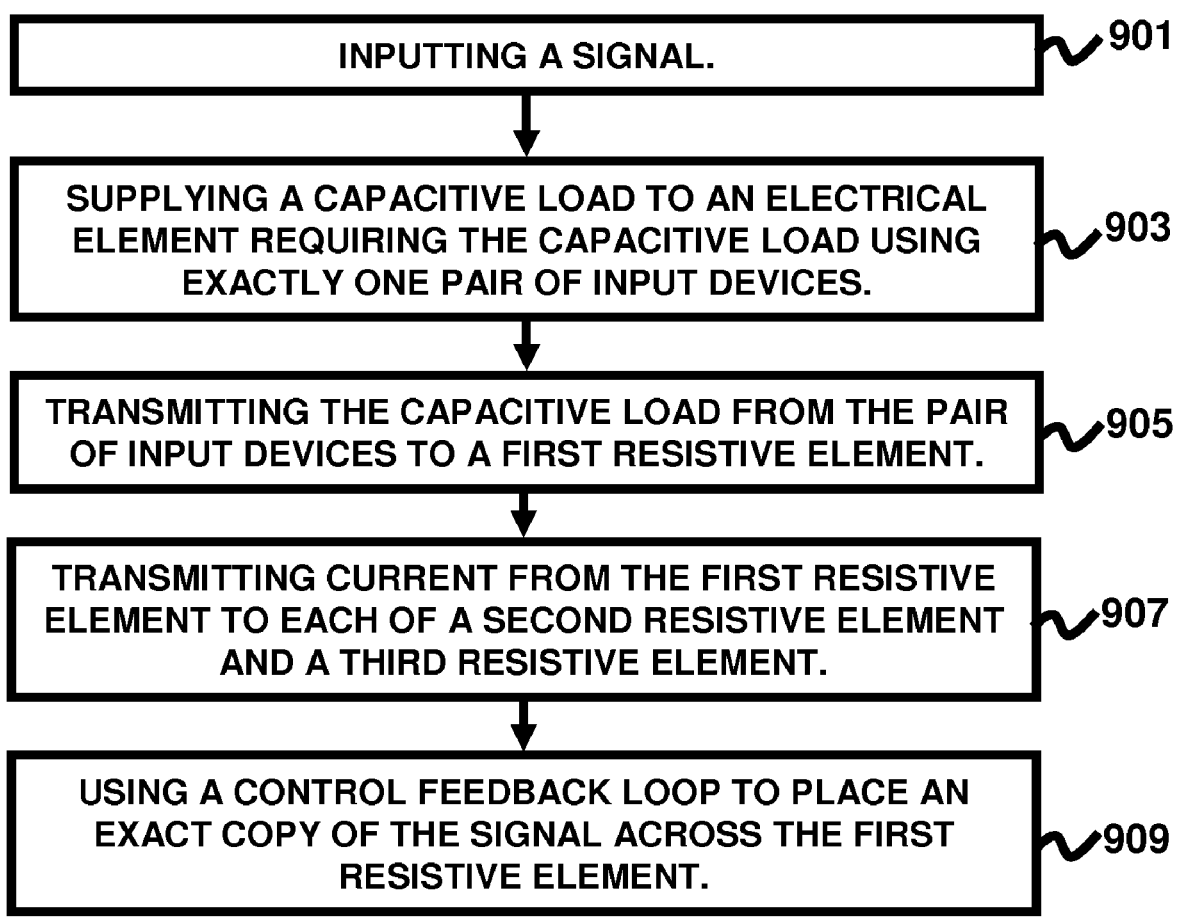

LOW NOISE, LOW POWER, HIGH LINEARITY DIFFERENTIAL AMPLIFIER WITH A CAPACITIVE INPUT IMPEDANCE

BACKGROUND

1. Technical Field

The embodiments herein generally relate to electrical amplifiers, and, more particularly, to differential low noise amplifiers.

2. Description of the Related Art

Conventional low noise amplifiers can have instrumentation amplifier architectures and differential difference amplifier architectures. A block diagram of an instrumentation amplifier architecture is shown in FIG. 1(A). FIG. 1(B) illustrates one possible circuit implementation of the architecture of FIG. 1(A). In this architecture, two identical amplifiers Ap and An are used to provide capacitive input impedance to the Inp and Inn terminal and sense the voltage difference across its input terminals and provides gain to their respective output. With the feedback loop the output is regulated to be:

$$V_{out} = \left(1 + \frac{Zf}{Zi}\right) V_{in}.$$

In FIG. 1(B), a traditional two stage opamp is used as illustration and from basic opamp theory, it is known that the noise of the opamp is dominated by the first stage devices, which are devices 101-105, 201-205, as the second stage device noise is attenuated by the gain of the first stage and thus can be neglected for most practical cases. In addition to the four passive components Zip,Zin and Zfp,Zfn, there are four input active devices 101, 102, 201, 202, four active load devices 103, 104, 203, 204, and two tail current devices 105, 205 that contributes to the total input noise. The detailed noise voltage spectral density equation is as follows and here it is assumed that the device noise primarily consists of thermal noise and flicker noise:

$$V^2_{noise,total} = V^2_{device,thermal-noise} + V^2_{device,flicker-noise} + V^2_{passive,thermal-noise}$$

$$V^2_{device,thermal-noise} = 4 \cdot \frac{4kT\gamma}{gm_{101}} + 4 \cdot \frac{4kT\gamma \cdot gm_{103}}{gm^2_{101}} + 2 \cdot \frac{4kT\gamma \cdot gm_{105}}{gm^2_{101}}$$

$$V^2_{device,flicker-noise} = 4 \cdot \frac{K}{(WL)_{101}C_{OX}f} + 4 \frac{K \cdot gm^2_{103}}{(WL)_{103}C_{OX}f \cdot gm^2_{101}} + 2 \cdot \frac{K \cdot gm^2_{105}}{(WL)_{105}C_{OX}f \cdot gm^2_{101}}$$

$$V^2_{passive,thermal-noise} = 2 \cdot V^2_{noise,Zip} + 2 \cdot \frac{V^2_{noise,Zfp}}{G^2}$$

Here, G stands for the gain of the amplifier and is determined by $$G = 1 + \frac{Z_{fb}}{Z_{in}};$$

gm stands for the transconductance of the metal oxide semiconductor (MOS) device; K stands for the flicker noise constant; $C_{ox}$ stands for the oxide thickness; f stands for frequency; and $\gamma$ stands for the thermal noise constant. In practice, devices 101-104 are configured to have the same width and length and are biased with same current. Apart from manufacturing non-idealities it can be assumed that devices 101-104 are, to a first order, identical to each other. The same applies to device groups of (103, 104, 203, 204), (105, 205), (Zip, Zin), and (Zfp, Zfn). As noise is summed in the power domain, to achieve a given noise requirement, all devices have to be low in noise to meet the requirement and this mandates a lot of power to be consumed in both amplifiers Ap and An to meet a low level of noise floor.

The second approach is the differential difference amplifier. In this architecture, instead of two single ended amplifiers, a differential amplifier with two differential pair is used. However since the two terminal input to each differential pair is not exactly balanced depending on the loop gain, the tail current device still contributes to the total noise budget. In FIG. 1(B), elements 106, 206 are output stage bias transistors; elements 107, 207 are transistors in the output stage that provides gain; elements 108, 208 are zero canceling resistors or transistors for stability; and elements 109, 209 are Miller compensation capacitors. The diagram and an example of implementation of this architecture is shown in FIGS. 2(A) and 2(B), respectively. Four active input devices (221-224), two active load devices (225-226), two tail current devices (227-228), and four passive components (Zip, Zin, Zfp, Zfn) are identified that contribute to the majority of the total input noise. In FIG. 2(B), elements 229, 230 are output stage bias transistors; elements 231, 232 are transistors that provide gain in the output stage; elements 233, 236 are Miller compensation capacitors for stability; and elements 234, 235 are zero canceling resistors/transistors for stability. If the noise analysis that was performed for the instrumentation amplifier is repeated, the following noise equations are obtained:

$$V^2_{noise,total} = V^2_{device,thermal-noise} + V^2_{device,flicker-noise} + V^2_{passive,thermal-noise}$$

$$V^2_{device,thermal-noise} = 4 \cdot \frac{4kT\gamma}{gm_{221}} + 2 \cdot \frac{4kT\gamma \cdot gm_{225}}{gm^2_{221}} + 2 \cdot \frac{4kT\gamma \cdot gm_{227}}{gm^2_{221}}$$

$$V^2_{device,flicker-noise} = 4 \cdot \frac{K}{(WL)_{221}C_{OX}f} + 2 \frac{K \cdot gm^2_{225}}{(WL)_{225}C_{OX}f \cdot gm^2_{221}} + 2 \cdot \frac{K \cdot gm^2_{227}}{(WL)_{227}C_{OX}f \cdot gm^2_{221}}$$

$$V^2_{passive,thermal-noise} = 2 \cdot V^2_{noise,Zip} + 2 \cdot \frac{V^2_{noise,Zfp}}{G^2}$$

However, irrespective of which architecture is used, the conventional techniques tend to suffer from relatively high noise levels, common mode stability problems, and tend to require increased power levels for operation. Moreover, the conventional techniques, as indicated above, tend to require four active input devices. Accordingly, there remains a need for a new low noise, low power amplifier.

SUMMARY

In view of the foregoing, an embodiment provides a low noise, low power differential two-stage amplifier comprising an electrical element; exactly one pair of input devices adapted to supply a capacitive load to the electrical element requiring the capacitive load, wherein the pair of input devices are adapted to act as a voltage source follower; a first resistive element operatively connected to the pair of input devices and adapted to receive the capacitive load from the pair of input devices; a second resistive element adapted to receive current from the first resistive element; a third resistive element adapted to receive current from the first resistive element, wherein the second and third resistive elements are sized differently than the first resistive element in order to provide a voltage gain; a feedback loop operatively connected to the electrical element and the resistive elements; and a gain transistor adapted to sense and increase a loop gain of the feedback loop while the feedback loop is closed.

The gain transistor may comprise a Class A or Class AB output stage. Moreover, the amplifier may further comprise a compensation network comprising a capacitor. In one embodiment, the amplifier may further comprise a resistor in series with the capacitor. In another embodiment, the amplifier may further comprise a transistor in series with the capacitor. Additionally, the devices adapted to provide a capacitive load may comprise any of a pair of transistors, a pair of resistors, a resistor degenerated metal oxide semiconductor (MOS) device, and a dual NMOS and PMOS device. Furthermore, the feedback loop may comprise a common mode load feedback circuit operatively connected to at least one of the input devices.

Another embodiment provides a low noise, low power differential two-stage amplifier comprising a first stage comprising a pair of electrical devices that sense an input signal difference across the pair of electrical devices; and a control feedback loop operatively connected to the first stage, wherein the first stage in combination with the control loop feedback is adapted to place an exact copy of the signal across a first pair of resistive components, wherein the first pair of resistive components are adapted to generate a differential signal current, wherein the control feedback loop is adapted to ensure that the differential signal current goes a second pair of resistive components to generate a voltage output. Preferably, the first and second pair of resistive components are in ratio to produce the exact copy of the signal with some gain at an output of the first stage. Moreover, the control loop feedback preferably comprises a common mode loop.

Another embodiment provides a method of reducing noise and power in a differential two-stage amplifier, wherein the method comprises inputting a signal; supplying a capacitive load to an electrical element requiring the capacitive load using exactly one pair of input devices, wherein the pair of input devices are adapted to act as a voltage source follower; transmitting the capacitive load from the pair of input devices to a first resistive element operatively connected to the pair of input devices; transmitting current from the first resistive element to each of a second resistive element and a third resistive element, wherein the second and third resistive elements are sized greater than the first resistive element in order to provide a voltage gain; and using a control feedback loop to place an exact copy of the signal across the first resistive element, wherein the first resistive element is adapted to generate a differential signal current, wherein the control feedback loop is adapted to ensure that the differential signal current goes to the second resistive element to generate a voltage output.

The method may further comprise using a gain transistor to sense and increase a loop gain of the control feedback loop while the control feedback loop is closed. Furthermore, the gain transistor may comprise a Class A or Class AB output stage. Moreover, the method may further comprise configuring a compensation network comprising a capacitor in the amplifier. Also, the method may further comprise configuring a resistor in series with the capacitor. Additionally, the method may further comprise configuring a transistor in series with the capacitor. Preferably, the devices adapted to provide a capacitive load comprises any of a pair of transistors, a pair of resistors, a resistor degenerated MOS device, and a dual NMOS and PMOS device. Furthermore, the control loop feedback preferably comprises a common mode loop.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 9 is a flow diagram illustrating a preferred method according to an embodiment herein.

DETAILED DESCRIPTION OF PREFERRED EMBODIMENTS

Figure 1A:
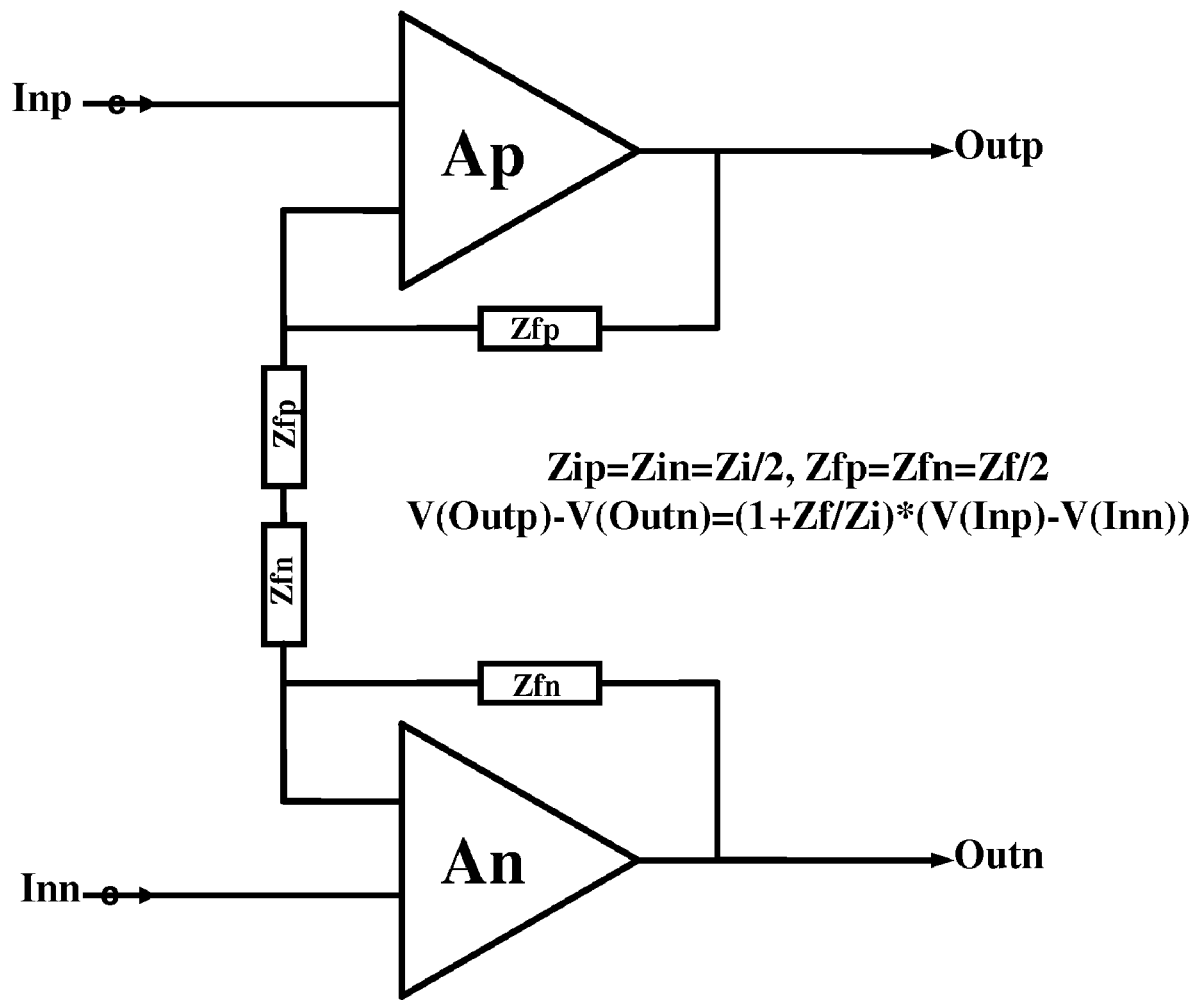
FIG. 1(A) illustrates a schematic block diagram of a conventional differential instrumentation amplifier using two single-ended operational amplifiers.
Figure 1B:
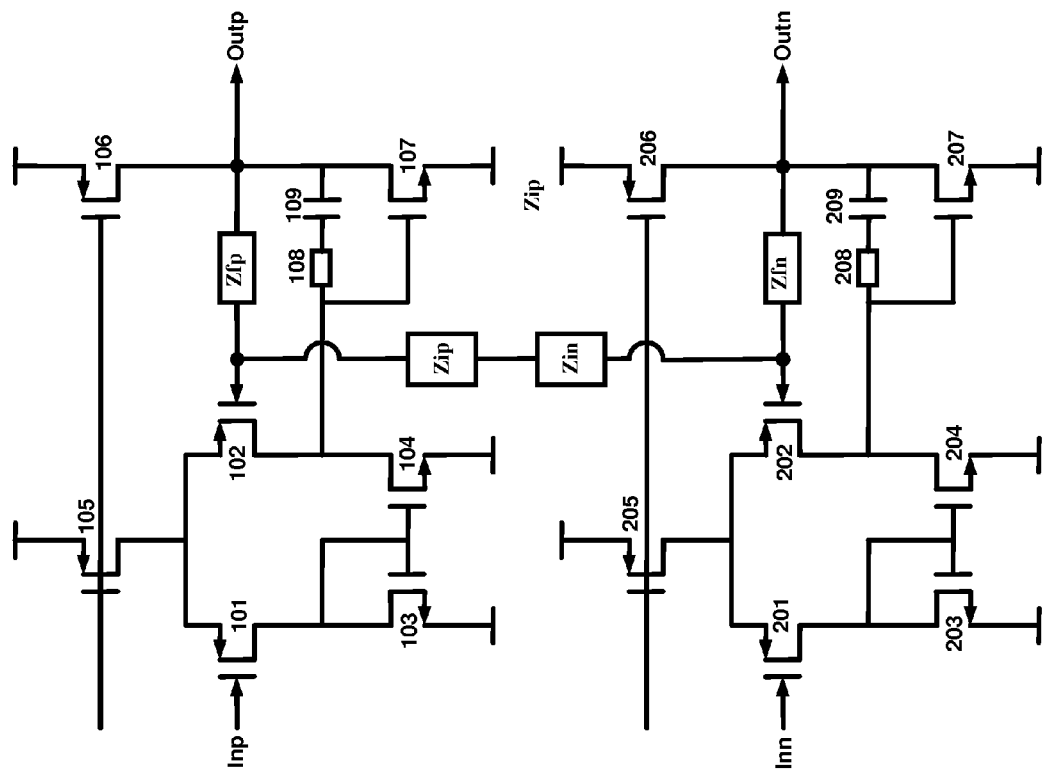
FIG. 1(B) illustrates a schematic circuit diagram of the conventional differential instrumentation amplifier using two single-ended operational amplifiers of FIG. 1(A)
Figure 2A:
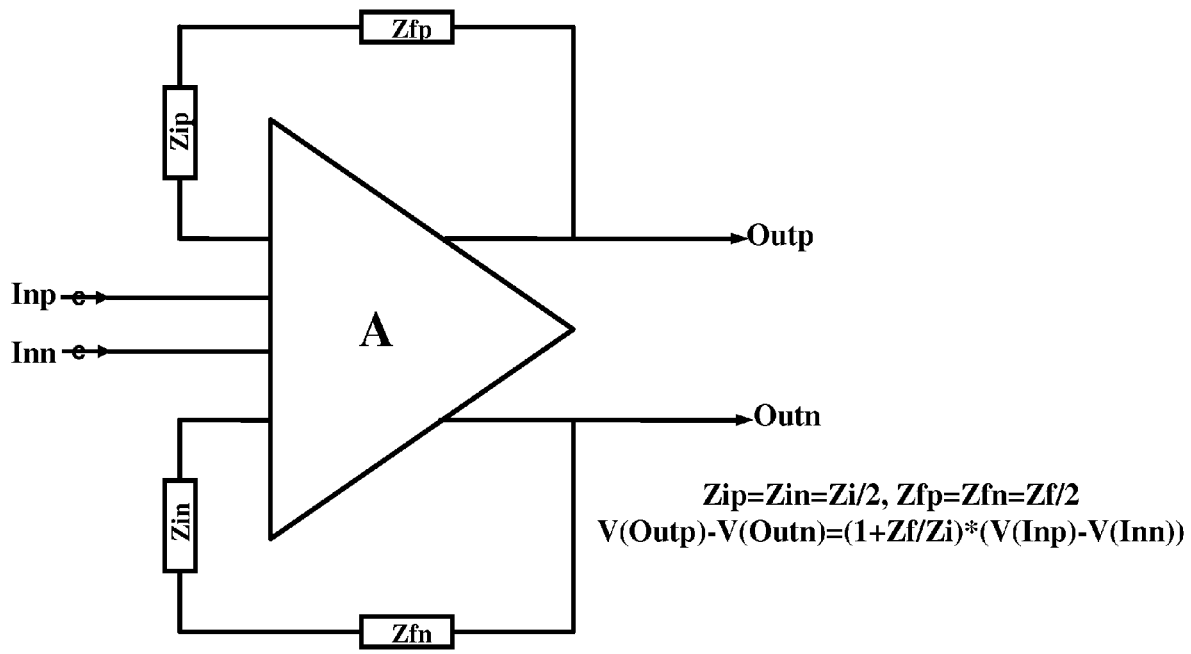
FIG. 2(A) illustrates a schematic block diagram of a conventional differential instrumentation amplifier using a differential difference amplifier.
Figure 2B:
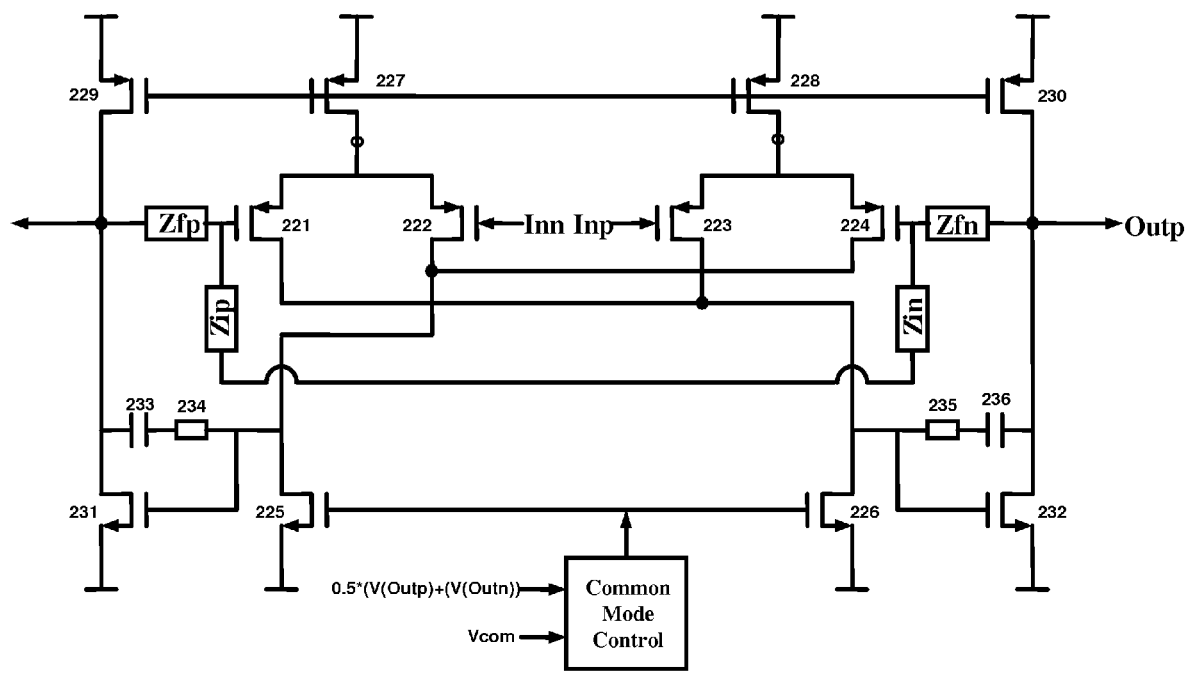
FIG. 2(B) illustrates a schematic circuit diagram of the conventional differential instrumentation amplifier using a differential difference amplifier of FIG. 2(A)

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a new low noise, low power amplifier. The embodiments herein achieve this by providing a low noise, low power, high linearity differential amplifier that may be used in wireless applications, wherein the amplifier has a capacitive input impedance that interfaces with a mixer such that the amplifier is capable of resulting in half the noise and requiring half the power requirements of the conventional amplifiers by minimizing the number of required input devices to the amplifier. The embodiments herein can be used as a low noise amplifier to interface with any electrical element that requires a capacitive input impedance. Furthermore, the architecture provided by the embodiments herein has been experimentally verified. While consuming less power, the amplifier reduces its input referred noise spectral density from 4.7 nv/sqrt(Hz) to 3.6 nv/sqrt(Hz).

Referring now to the drawings, and more particularly to FIGS. 3(A) through 9, where similar reference characters denote corresponding features consistently throughout the figures, there are shown preferred embodiments.

Figure 3A:
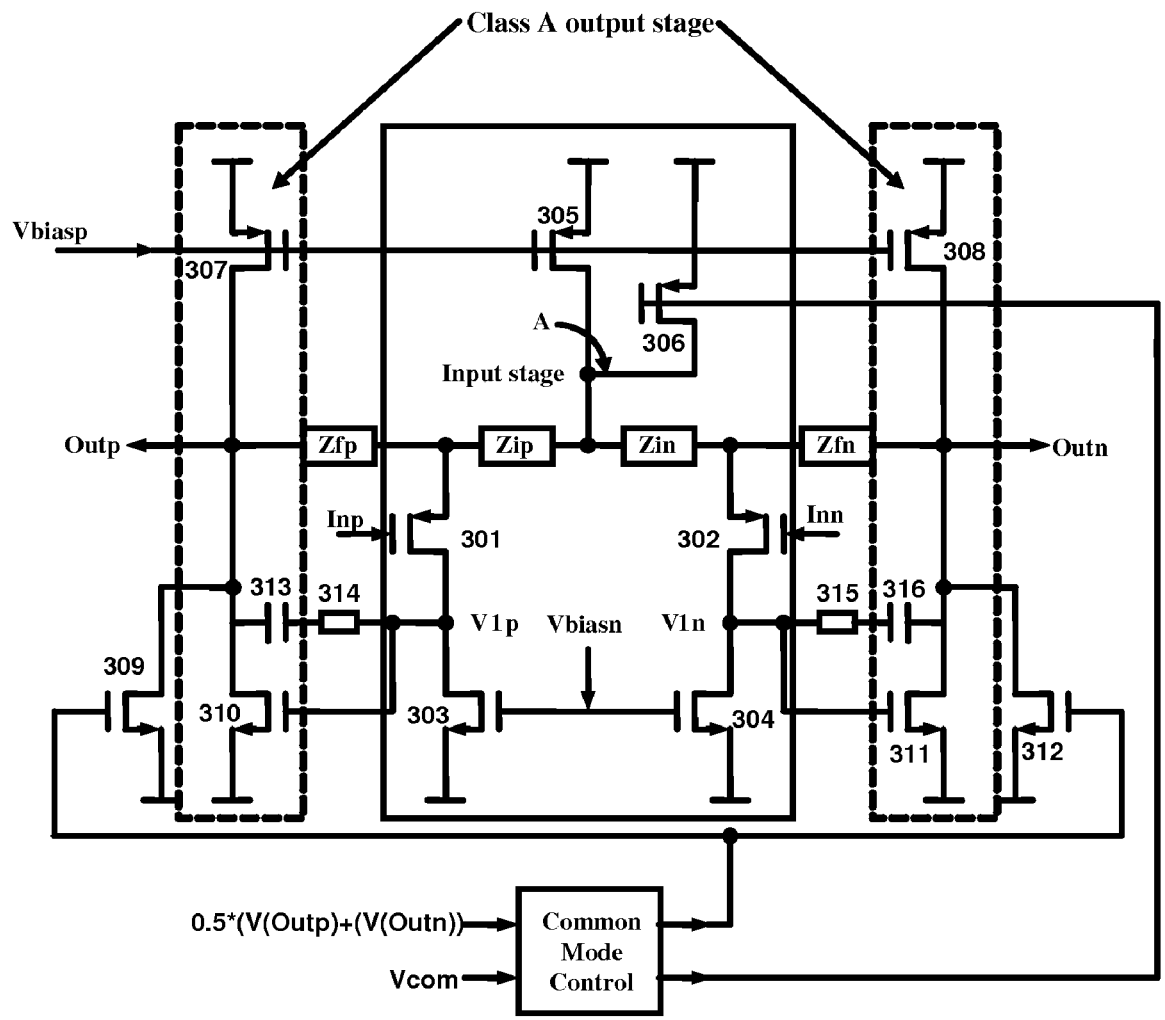
FIG. 3(A) illustrates a schematic circuit diagram of a low noise, low power, high linearity amplifier according to an embodiment herein.
Figure 3B:
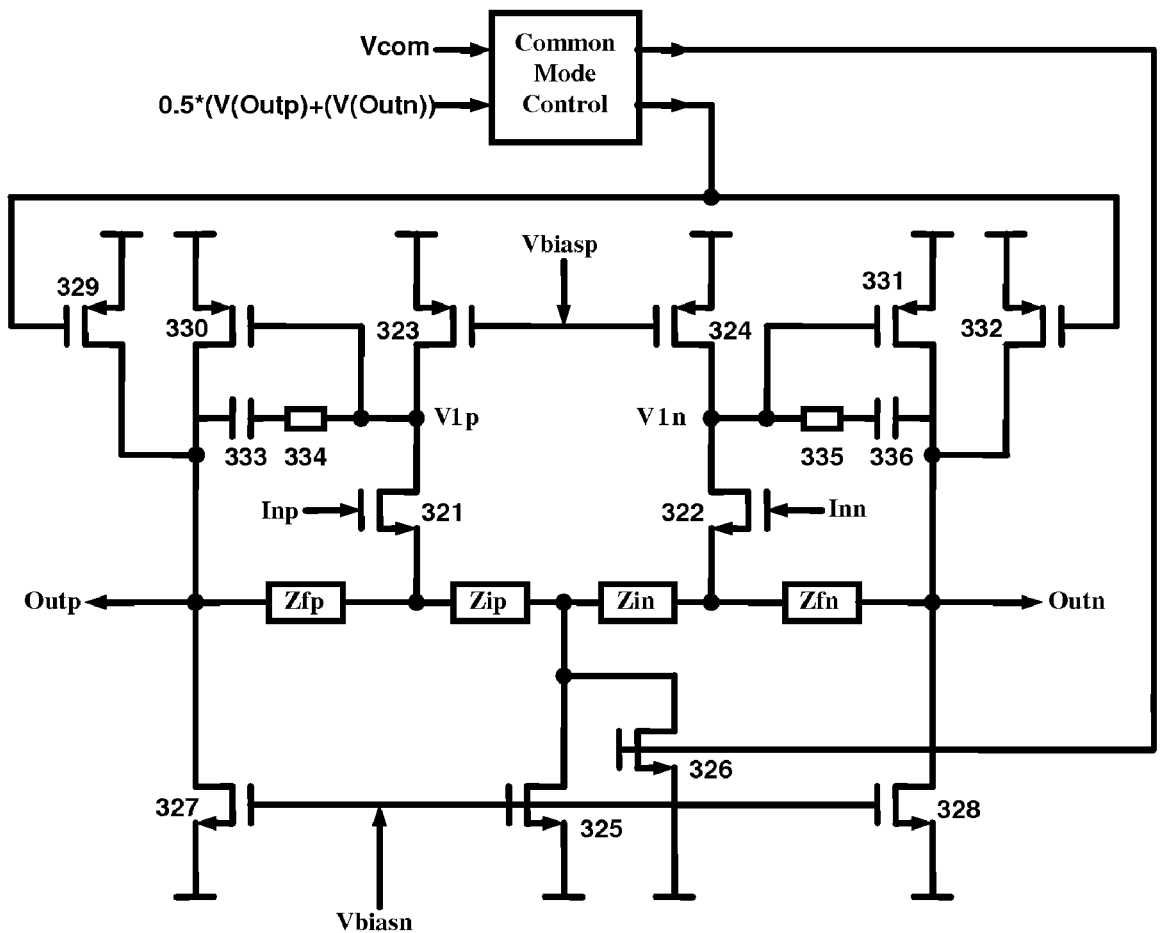
FIG. 3(B) illustrates a schematic circuit diagram of the amplifier of FIG. 3(A) with an NMOS input active device and a PMOS active load according to a first alternative embodiment herein.
Figure 3C:
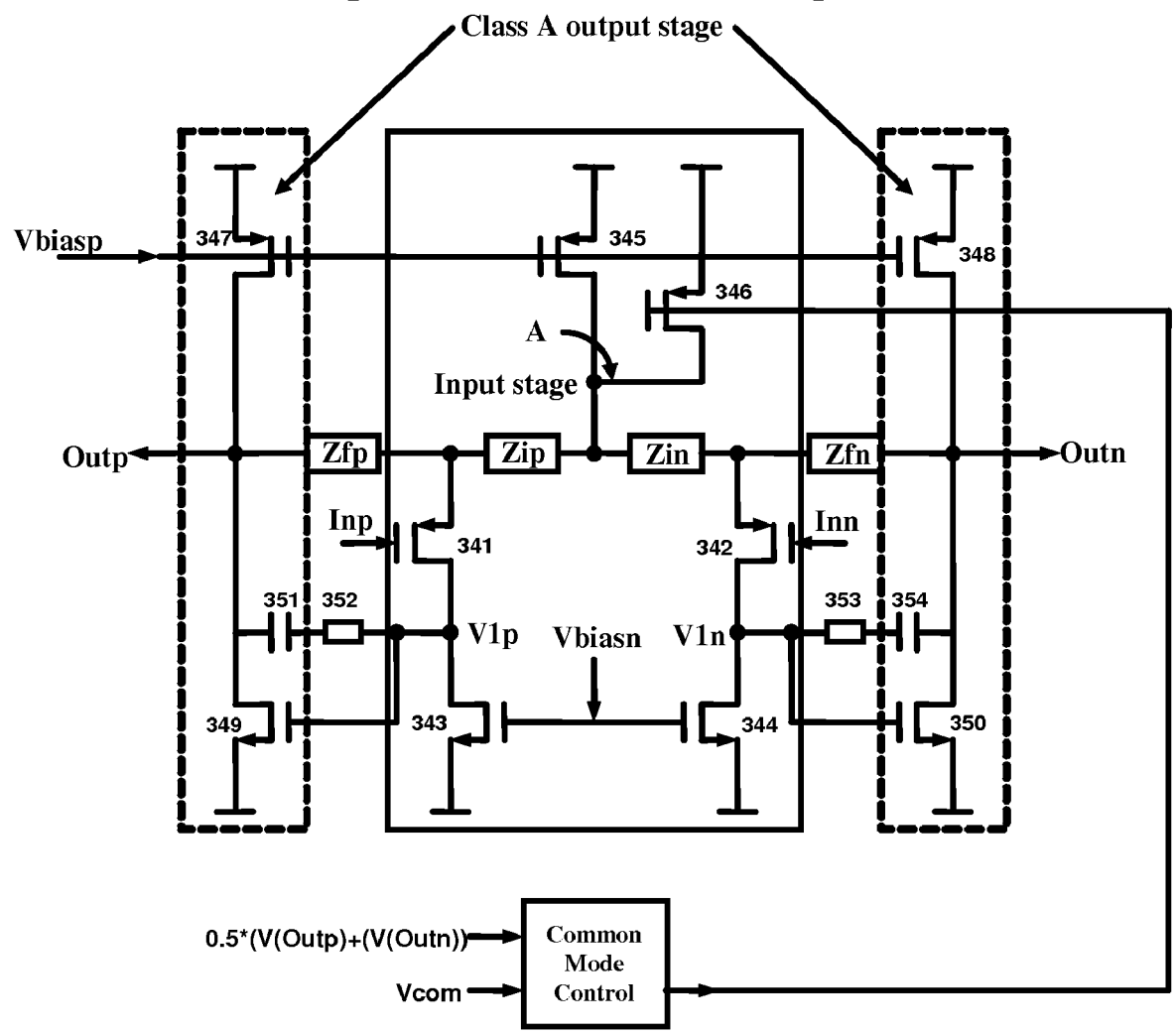
FIG. 3(C) illustrates a schematic circuit diagram of the amplifier of FIG. 3(A) with an alternative common mode loop feedback according to a second alternative embodiment herein.

The embodiments herein address the problems associated with the conventional solutions by using an amplifier architecture as illustrated in FIGS. 3(A) through 3(C). Dominant noise generating devices are four passive components Zip, Zin, Zfp, Zfn plus two active input devices 301-302, and two load devices 303-304, which is a significant improvement as far as noise is concerned compared with the conventional amplifiers (of FIGS. 1(A) through 2(B)).

Going through the detailed noise equations of this structure, and again, assuming devices (301, 302),(303, 304) are matched, the following equations are derived:

$$V^2_{noise,total} = V^2_{device,thermal-noise} + V^2_{device,flicker-noise} + V^2_{passive,thermal-noise}$$

$$V^2_{device,thermal-noise} = 2 \cdot \frac{4kT\gamma}{gm_{301}} + 2 \cdot \frac{4kT\gamma \cdot gm_{303}}{gm^2_{301}} + \frac{4kT\gamma \cdot (gm_{305} + gm_{305})}{gm^2_{301}}$$

$$V^2_{device,flicker-noise} = 2 \cdot \frac{K}{(WL)_{301}C_{OX}f} + 2 \frac{K \cdot gm^2_{303}}{(WL)_{303}C_{OX}f \cdot gm^2_{301}} + \frac{K \cdot (gm^2_{305} + gm^2_{306})}{(WL)_{303}C_{OX}f \cdot gm^2_{301}}$$

$$V^2_{passive,thermal-noise} = 2 \cdot V^2_{noise,Zip} + 2 \cdot \frac{V^2_{noise,Zfp}}{G^2}$$

Immediately, several advantages of this architecture are recognizable with a comparison with the two conventional architectures previously described being demonstrated in the following table:

| Noise | Instrumentation (1) | Differential Difference (2) | Current Embodiments (3) |
|---|---|---|---|
| Thermal noise from active input devices | $4 \cdot \frac{4kT\gamma}{gm_{iput}} \leftarrow$ Dominant Noise Source | $4 \cdot \frac{4kT\gamma}{gm_{iput}} \leftarrow$ Dominant Noise Source | $2 \cdot \frac{4kT\gamma}{gm_{iput}} \leftarrow$ Dominant Noise Source |
| Flicker noise from active input devices | $4 \cdot \frac{K}{(WL)_{input}C_{OX}f} \leftarrow$ Dominant Noise Source | $4 \cdot \frac{K}{(WL)_{input}C_{OX}f} \leftarrow$ Dominant Noise Source | $2 \cdot \frac{K}{(WL)_{input}C_{OX}f} \leftarrow$ Dominant Noise Source |
| Thermal noise from active load devices | $4 \cdot \frac{4kT\gamma \cdot gm_{load}}{gm^2_{input}}$ | $2 \cdot \frac{4kT\gamma \cdot gm_{load}}{gm^2_{input}}$ | $2 \cdot \frac{4kT\gamma \cdot gm_{load}}{gm^2_{input}}$ |
| Flicker noise from active load devices | $4 \frac{K \cdot gm^2_{load}}{(WL)_{load}C_{OX}f \cdot gm^2_{input}}$ | $2 \frac{K \cdot gm^2_{load}}{(WL)_{load}C_{OX}f \cdot gm^2_{input}}$ | $2 \frac{K \cdot gm^2_{load}}{(WL)_{load}C_{OX}f \cdot gm^2_{input}}$ |
| Thermal noise from active tail current devices | $2 \cdot \frac{4kT\gamma \cdot gm_{tail}}{gm^2_{input}}$ | $2 \cdot \frac{4kT\gamma \cdot gm_{tail}}{gm^2_{input}}$ | $\frac{4kT\gamma \cdot (gm_{tail} + gm_{cm})}{gm^2_{input}}$ |
| Flicker noise from active tail current devices | $2 \cdot \frac{K \cdot gm^2_{tail}}{(WL)_{tail}C_{OX}f \cdot gm^2_{input}}$ | $2 \cdot \frac{K \cdot gm^2_{tail}}{(WL)_{tail}C_{OX}f \cdot gm^2_{input}}$ | $\frac{K \cdot (gm^2_{tail} + gm^2_{cm})}{(WL)_{103}C_{OX}f \cdot gm^2_{input}}$ |

-continued

| Noise | Instrumentation (1) | Differential Difference (2) | Current Embodiments (3) |
|---|---|---|---|
| Passive component noise | $2 \cdot V^2_{noise,Zip} + 2 \cdot \frac{V^2_{noise,Zfp}}{G^2}$ | $2 \cdot V^2_{noise,Zip} + 2 \cdot \frac{V^2_{noise,Zfp}}{G^2}$ | $2 \cdot V^2_{noise,Zip} + 2 \cdot \frac{V^2_{noise,Zfp}}{G^2}$ |

It is shown that when everything else is equal, according to the architecture provided by the embodiments herein, there are two distinctive advantages. First, the input devices' 301, 302 thermal and flicker is half of the other two conventional types of topology. Second, the load devices' 303, 304 thermal and flicker noise is either half or equal to the other two conventional types of topology.

The dominant noise source comes from the input devices 301, 302, which directly appear at the input while all other noise, such as noise from load devices 303, 304 are scaled by the input's transconductance gm. Therefore, the thermal and flicker noise from the input device 301, 302 is the fundamental root cause of the performance limit. Accordingly, the embodiments herein reduce the noise by a factor of two, which is a very significant improvement in the industry. The amplifier illustrated in FIG. 3(A) further includes an input stage tail current bias transistor 305; a common mode feedback transistor 306 for the input stage; output stage bias transistors 307, 308; gain transistors 310, 311 in the output stage; common mode feedback transistors 309, 312 for the output stage; Miller compensation capacitors 313, 316; and zero canceling resistors/transistors 314, 315 for stability.

Next, an analysis is provided as to why these improvements provided by the embodiments herein offer significant noise advantages when same power is consumed or in another aspect, while meeting the same noise spec, and why this offers a significant power savings.

In most low noise applications, thermal noise is the dominant noise that limits the performance and active devices from the amplifier contribute much more thermal noise than passive elements Zip(n), Zfp(n), which are usually resistors. In CMOS technology, the active device's thermal noise is inverse proportionally related to the device's gm, which is related to the device current in a square law proportion; e.g., $gm_{in} \propto \sqrt{I_{in}}$.

If it is assumed that the input stage is where most of the power is consumed, then: (1) In the first case, the three types of amplifier topology are compared while meeting the same noise spec. If the amplifiers are all properly designed, which means that the amplifiers' thermal noise is dominated by input devices, it will lead to:

$$2 \cdot \frac{4kT\gamma}{gm_{input}}\bigg|_{(3)} = 4 \cdot \frac{4kT\gamma}{gm_{input}}\bigg|_{(1)\ or\ (2)} \Rightarrow gm_{input}|_{(3)} =$$

$$0.5 * gm_{input}|_{(1)\ or\ (2)} \Rightarrow I_{in}|_{(3)} = 0.25 * I_{in}|_{(1)\ or\ (2)}$$

if it is assumed that the passive component's noise contribution is the same for all three amplifiers. This is a four-fold power savings and is a tremendous advantage by the embodiments herein. (2) In the second case, if the same power consumption is assumed and it is also assumed that passive components contribute approximately one-third of the total noise, then:

$$V^2_{noise,total}|_{(1)\ or\ (2)} = 4 \cdot \frac{4kT\gamma}{gm_{input}}\bigg|_{(1)\ or\ (2)} * \frac{3}{2}$$

$$V^2_{noise,total}|_{(3)} = 2 \cdot \frac{4kT\gamma}{gm_{input}}\bigg|_{(3)} * \frac{3}{2}$$

If the size of the input device 301, 302 is doubled (this will increase the input capacitance by two-fold and in general it is not an issue) in the architecture provided by the embodiments herein while also doubling the current, this will yield a two-fold increase in the gm value, and this will lead to a four-fold reduction in noise.

This also means that the passive components are reduced by four-fold to benefit from the noise reduction. However, when the passive component's value is reduced by four times, more power must be consumed in the output stages and this will lead to an increase of power and the assumption that the input stage of the amplifier is where most of the power is consumed no longer holds. However, when a class AB type of output stage is utilized, the problem is much less of a concern.

Preferably, the input amplitude of the amplifier is within a given range. When the input amplitude is too big, devices of the amplifier no longer operates in the saturation region and the amplifier might run into non-linear state and generate increased harmonics at the output. However, for most wireless applications, the signal level after the mixer is still very small, which is an ideal place for this type of architecture. Moreover, in an alternative embodiment (3) a rail-to-rail input stage is utilized that solves this issue.

In FIG. 3(B), the same amplifier architecture is provided as in FIG. 3(A) except with a NMOS device as the active input device and a PMOS device as the active load device. The amplifier shown in FIG. 3(B) further includes input transistors 321, 322; input stage load transistors 323, 324; a bias transistor for the input stage 325; a common mode feedback transistor 326 for the input stage; bias transistors 327, 328 for the output stage; gain transistors 330, 331 for the output stage; common mode feedback transistors 329, 332 for the output stage; Miller compensation capacitors 333, 336; and zero canceling resistors/transistors 334, 335 for stability. In FIG. 3(C), an alternative way to implement the common mode loop feedback is illustrated. The amplifier in FIG. 3(C) further includes input transistors 341, 342; input stage load transistors 343, 344; an input stage bias transistor 345; a common mode feedback transistor 346 for the input stage; bias transistors 347, 348 for the output stage; gain transistors 349, 350 for the output stage; Miller compensation capacitors 351, 354; and zero canceling resistors/transistors 352, 353 for stability. Generally, the embodiments herein provide a new amplifier architecture that uses less devices, and hence generates lower noise. The embodiments herein provide a two-stage amplifier. However, more stages are possible with more complex compensation and will be described as alternative embodiments further below.

The first stage of the amplifier comprises devices that sense the input difference and through the loop feedback, places an exact copy of that signal across a pair of components (Rinp, Rinn) which are usually resistors to generate a differential signal current Idiff. The feedback loop ensures that the differential current Idiff goes through another pair of resistors (Rfbp,Rfbn) to generate a voltage output. As the two pair of resistors Rinp,Rinn and Rfbp,Rfbn are in ratio, an exact copy of the input signal is obtained with some gain at the output. Rinp, Rinn are Zip, Zin shown in FIG. 3(A); Rfbp, Rfbn are Zfp, Zfn shown in FIG. 3(A); Idiff is the current that goes through Zip.

The feedback loop of Rfbp,Rinp and Rfbn, Rinn regulates the loop so that the output and input meets the relationships:

$$V_{out} = V(outp) - V(Outn) = \left(1 + \frac{Zf}{Zi}\right)V_{in} = \left(1 + \frac{Zf}{Zi}\right)(V(inp) - V(inn))$$

A common mode loop is used depending on the input common mode, output common mode and input device's physical characteristics. For example, if the input common mode is high or the device itself has a high threshold voltage, a common mode loop is used to center the amplifier's output voltage at a required level.

Figure 4A:
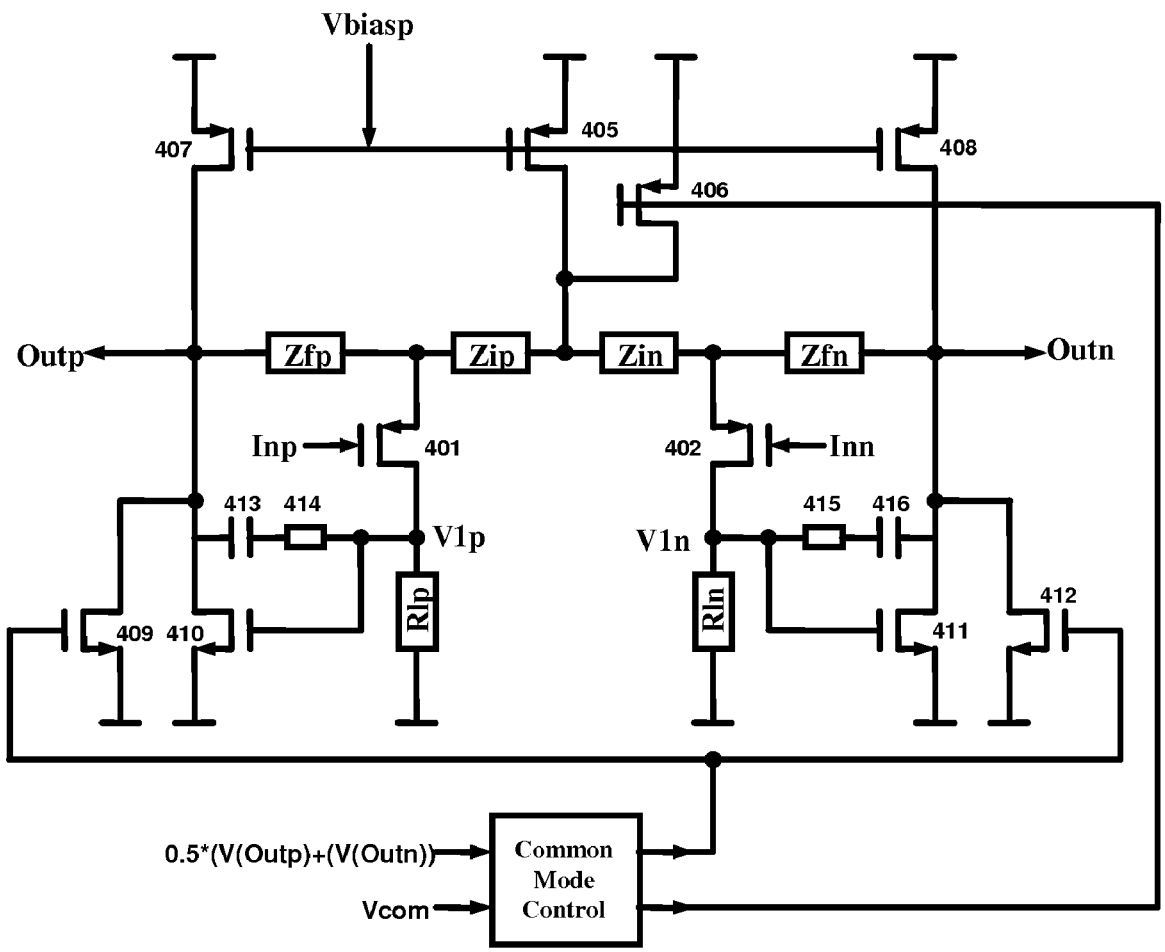
FIG. 4(A) illustrates a schematic circuit diagram of the amplifier of FIG. 3(A) with a resistor as an active load according to a third alternative embodiment herein.
Figure 4B:
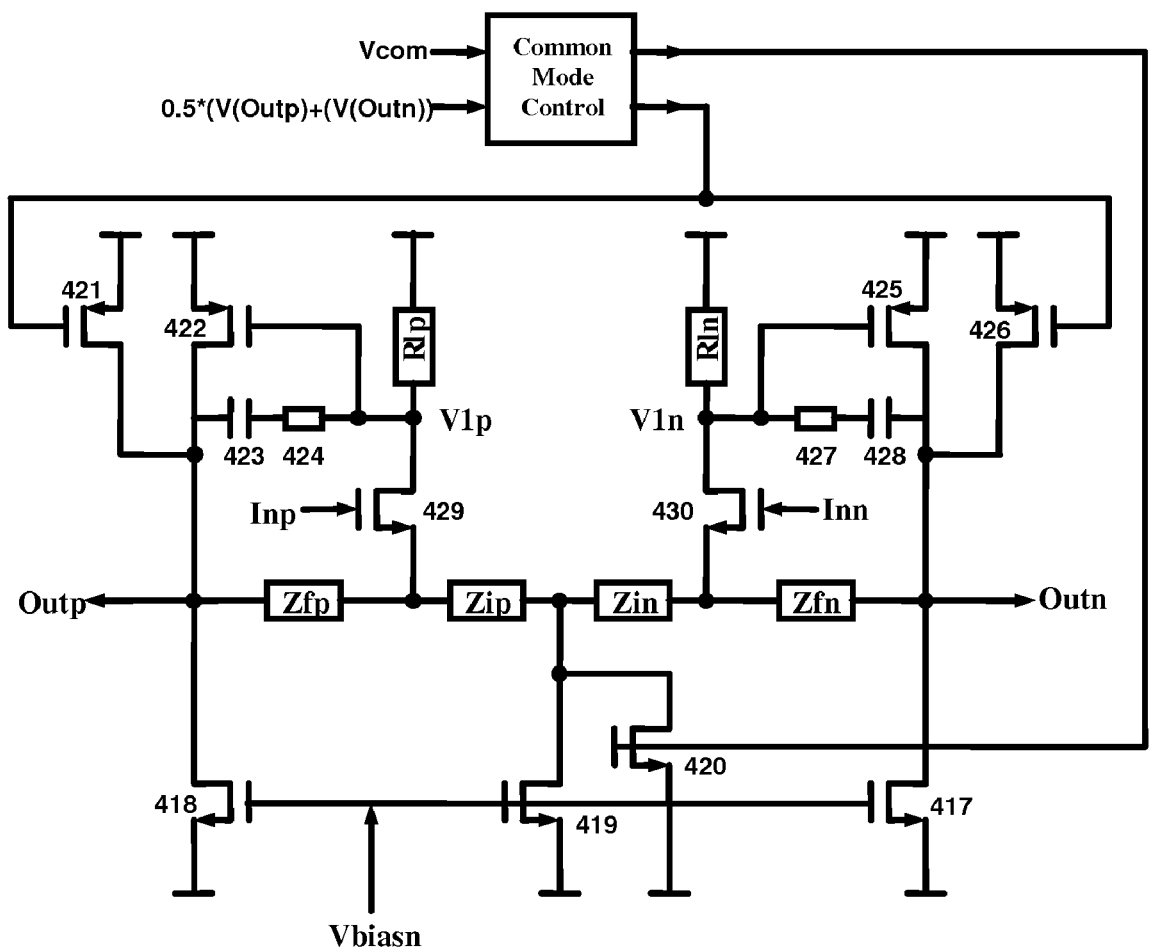
FIG. 4(B) illustrates a schematic circuit diagram of the amplifier of FIG. 3(B) with a resistor as an active load according to a fourth alternative embodiment herein.

Some examples of the alternative embodiments are described below: (1) Resistors as the load device (shown in FIG. 4(A)). In FIG. 3(A) there is shown an amplifier with MOS devices 304, 305 as active loads. In FIG. 3(B) there is shown an amplifier with MOS devices 323, 324 as active loads. FIGS. 4(A) and 4(B) illustrate two possible architectures with resistors (Rlp, Rln) as the load devices. This results in less noise and complexity. The amplifier illustrated in FIG. 4(A) further comprises input transistors 401, 402; input stage loads Rlp, Rln; a bias transistor 405 for the input stage; a common mode feedback transistor 406 for the input stage; output stage bias transistors 407, 408; gain transistors 410, 411 for the output stage; common mode feedback transistors 409, 412 for the output stage; Miller compensation capacitors 413, 416; and zero canceling resistors/transistors 414, 415 for stability. The amplifier shown in FIG. 4(B) further comprises output stage bias transistors 417, 418; an input stage bias transistor 419; a common mode feedback transistor 420 for the input stage; common mode feedback transistors 421, 426 for the output stage; gain transistors 422, 425 for the output stage; Miller compensation capacitors 423, 428; zero canceling resistors/transistors 424, 427 for stability; and input transistors 429, 430.

Figure 5A:
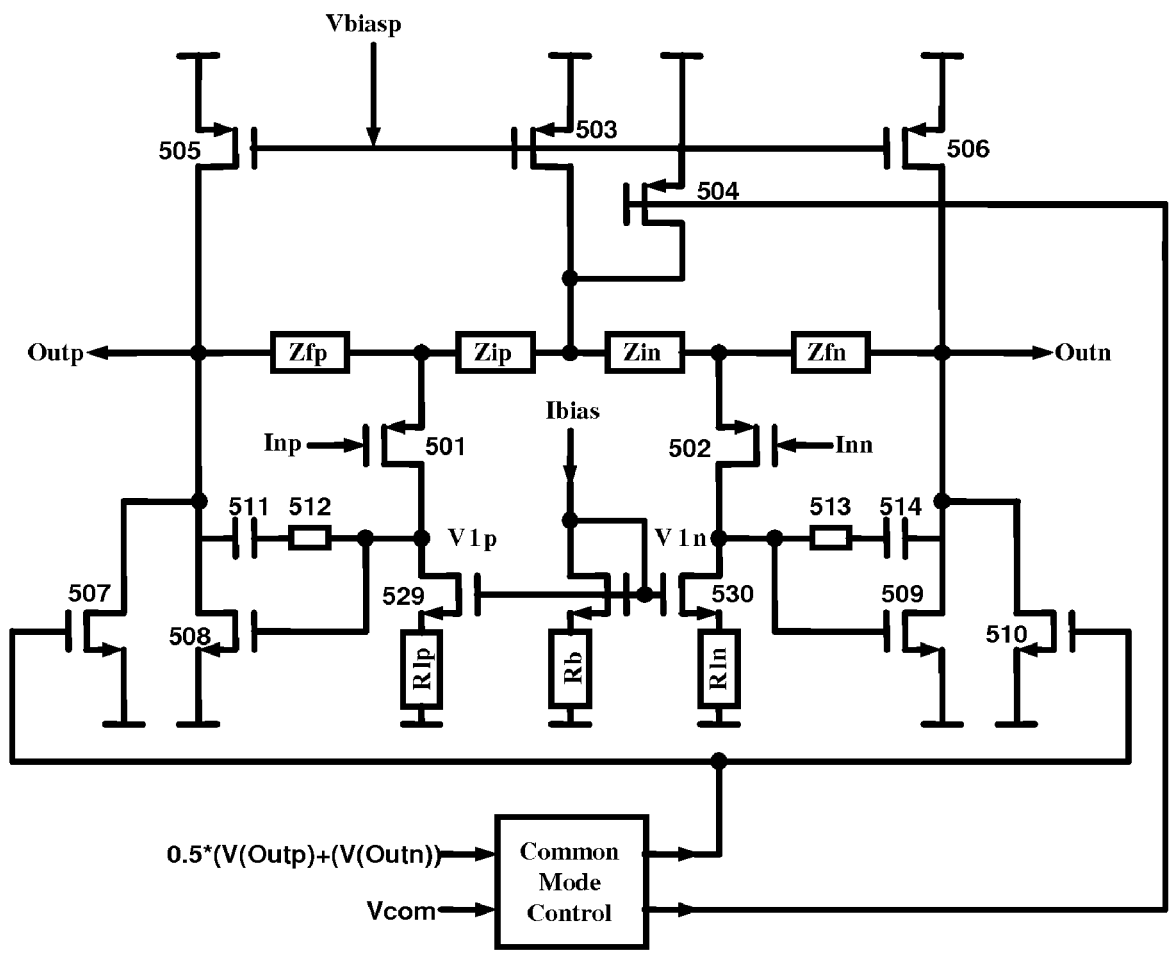
FIG. 5(A) illustrates a schematic circuit diagram of the amplifier of FIG. 3(A) with a resistor degenerated active device as the load according to a fifth alternative embodiment herein.
Figure 5B:
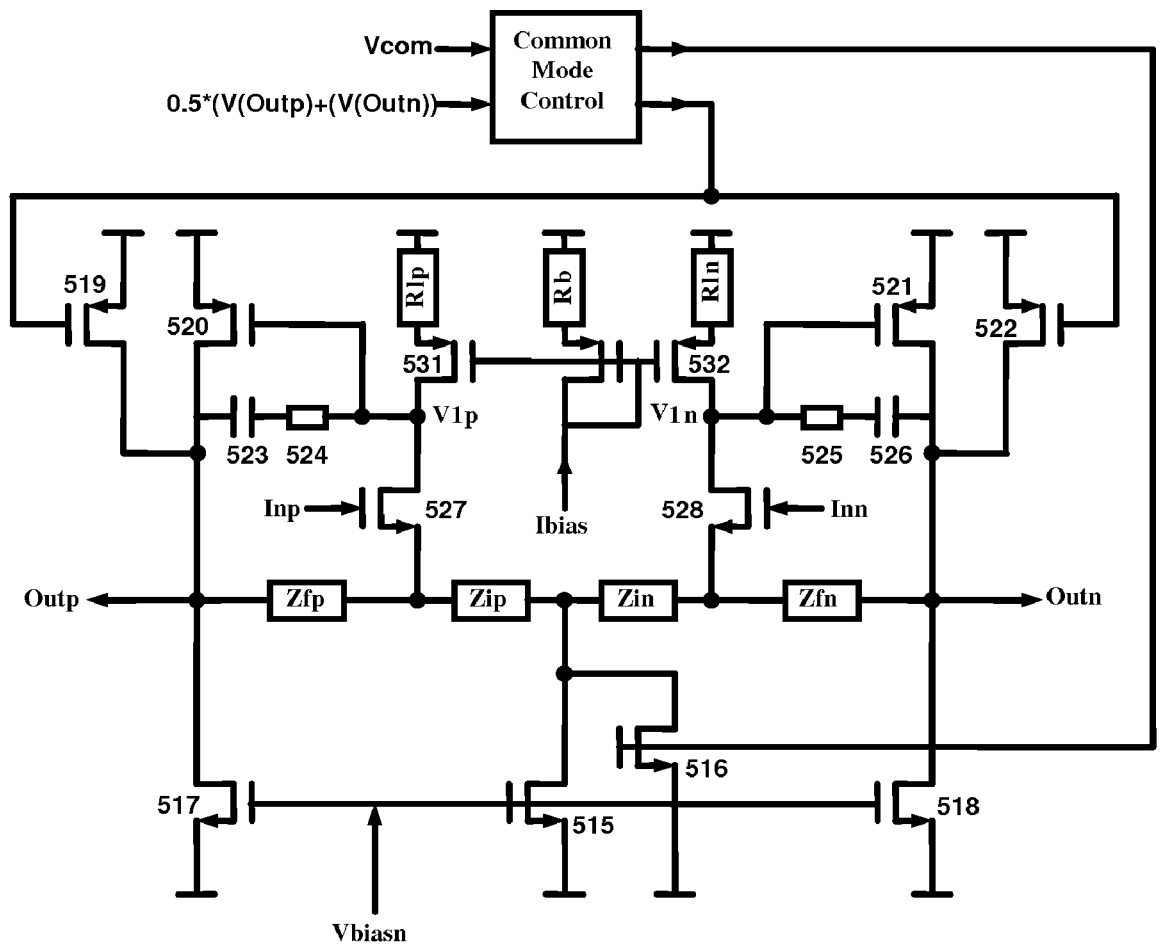
FIG. 5(B) illustrates a schematic circuit diagram of the amplifier of FIG. 3(B) with a resistor degenerated active device as the load according to a sixth alternative embodiment herein.

(2) Resistor degenerated MOS device as the load. In FIGS. 5(A) and 5(B), a pair of resistor degenerated MOS devices 529, 530 serve as the load element. This results in less noise than an active load and is comparable to a resistor load; high open loop gain and good linearity; and biasing current tracks input bias which has much less variation as a pure resistive load. The amplifier of FIG. 5(A) includes input transistors 501, 502; an input stage bias transistor 503; a common mode feedback transistor 504 for the input stage; output stage bias transistors 505, 506; output stage gain transistors 508, 509; common mode feedback transistors 507, 510 for the output stage; Miller compensation capacitors 511, 514; and zero canceling resistors/transistors 512, 513 that improves stability. Rlp, Rln as well as the transistors 529, 530 serve as active load for the input stage. The amplifier of FIG. 5(B) includes input transistors 527, 528; an input stage bias transistor 515; a common mode feedback transistor 516 for the input stage; output stage bias transistors 517, 518; output stage gain transistors 520, 521; common mode feedback transistors 519, 522 for the output stage; Miller compensation capacitors 523, 526; and are zero canceling resistors/transistors 524, 525 that improve stability. Rlp, Rln as well as the transistors 531, 532 serve as active load for the input stage.

Figure 6:
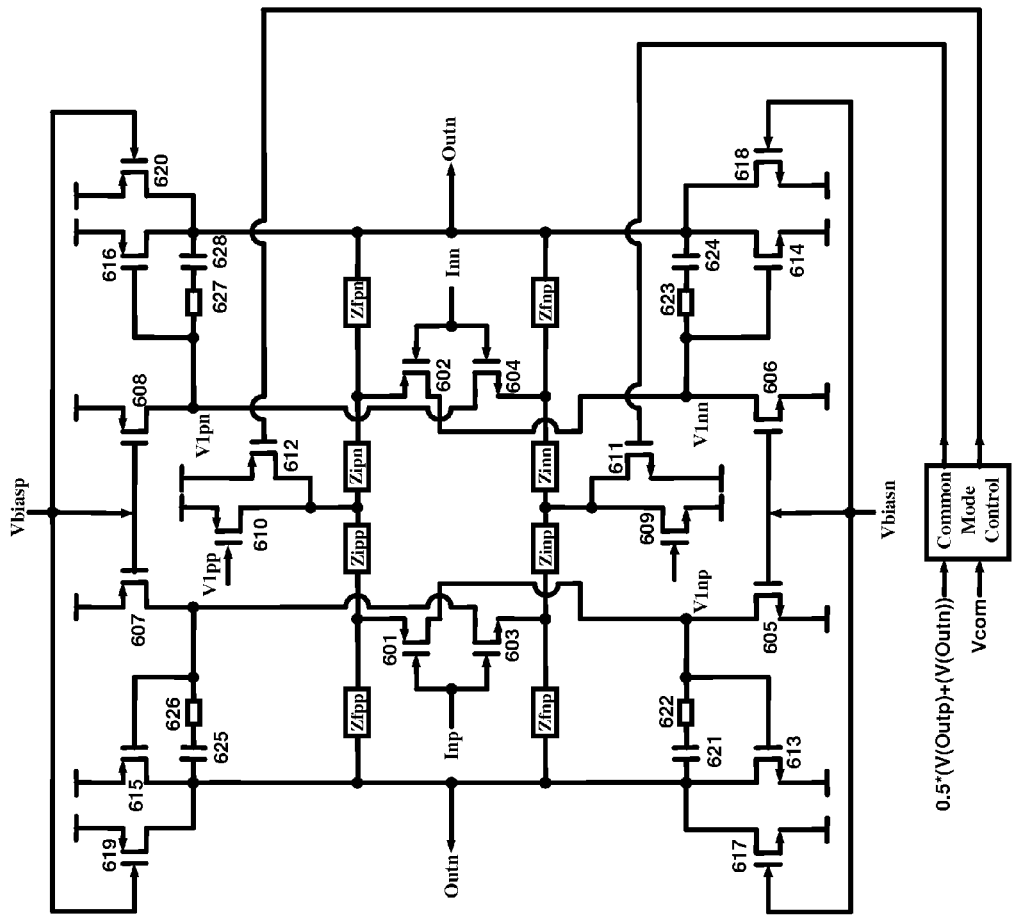
FIG. 6 illustrates a schematic circuit diagram of an amplifier with a dual NMOS and PMOS input active device to achieve rail to rail operation according to a seventh alternative embodiment herein.

(3) Dual NMOS input and PMOS input device for rail-to-rail operation. In FIGS. 3(B) and 4(B), there is shown either PMOS or NMOS input devices. However, this architecture can be easily adopted in rail-to-rail operations, as shown in FIG. 6, which means both the PMOS and NMOS input devices are employed. The amplifier illustrated in FIG. 6 includes input transistors 601, 602, 603, 604; input stage bias transistor 609, 610; common mode feedback transistors 611, 612 for the input stage; output stage gain transistors 613, 614, 615, 616; common mode feedback transistors 617, 618, 619, 620 for the output stage; Miller compensation capacitors 621, 624, 625, 628; zero canceling resistors/transistors 622, 623, 626, 627 that improve stability; and transistors 605, 606, 607, 608 serving as the active load for the input stage.

Figure 7:
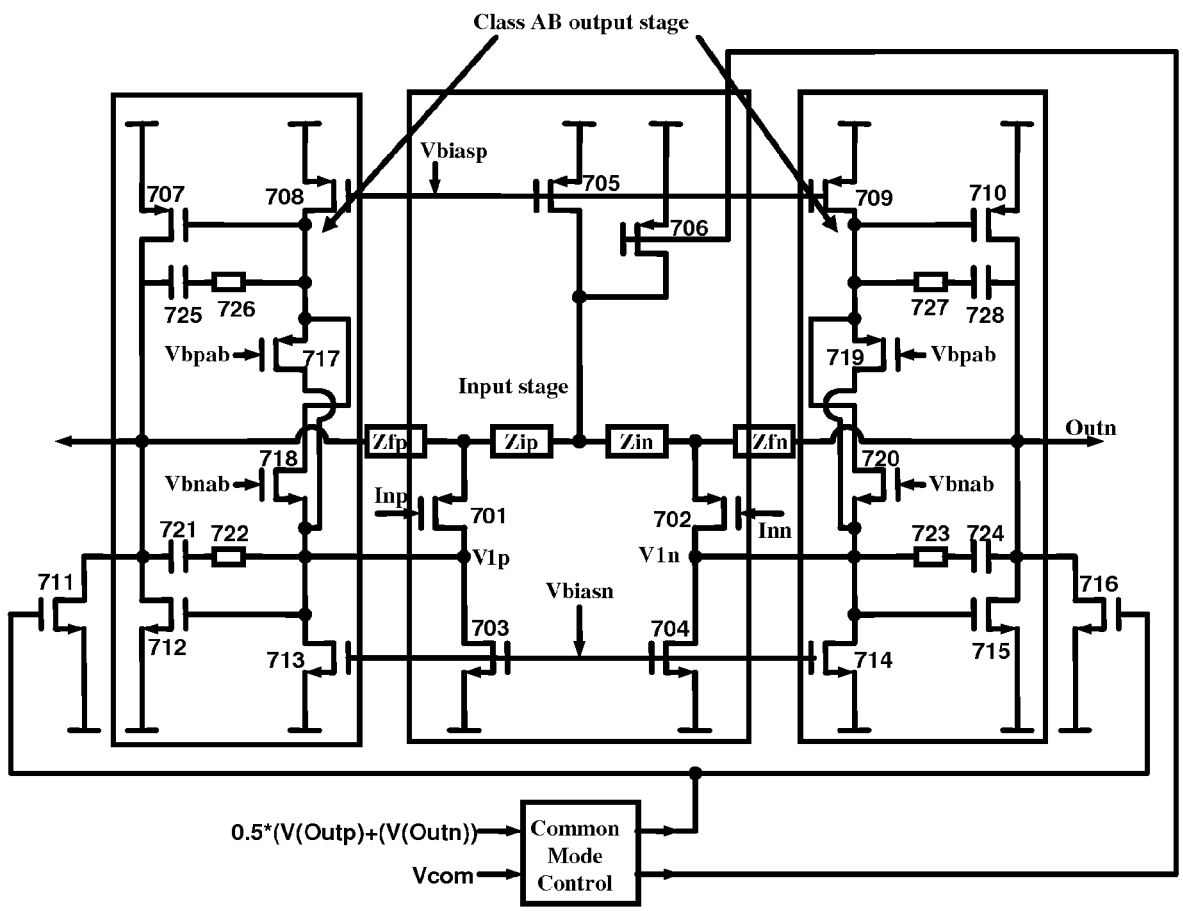
FIG. 7 illustrates a schematic circuit diagram of the amplifier of FIG. 3(A) with a class AB output stage according to an eighth alternative embodiment herein.
Figure 8:
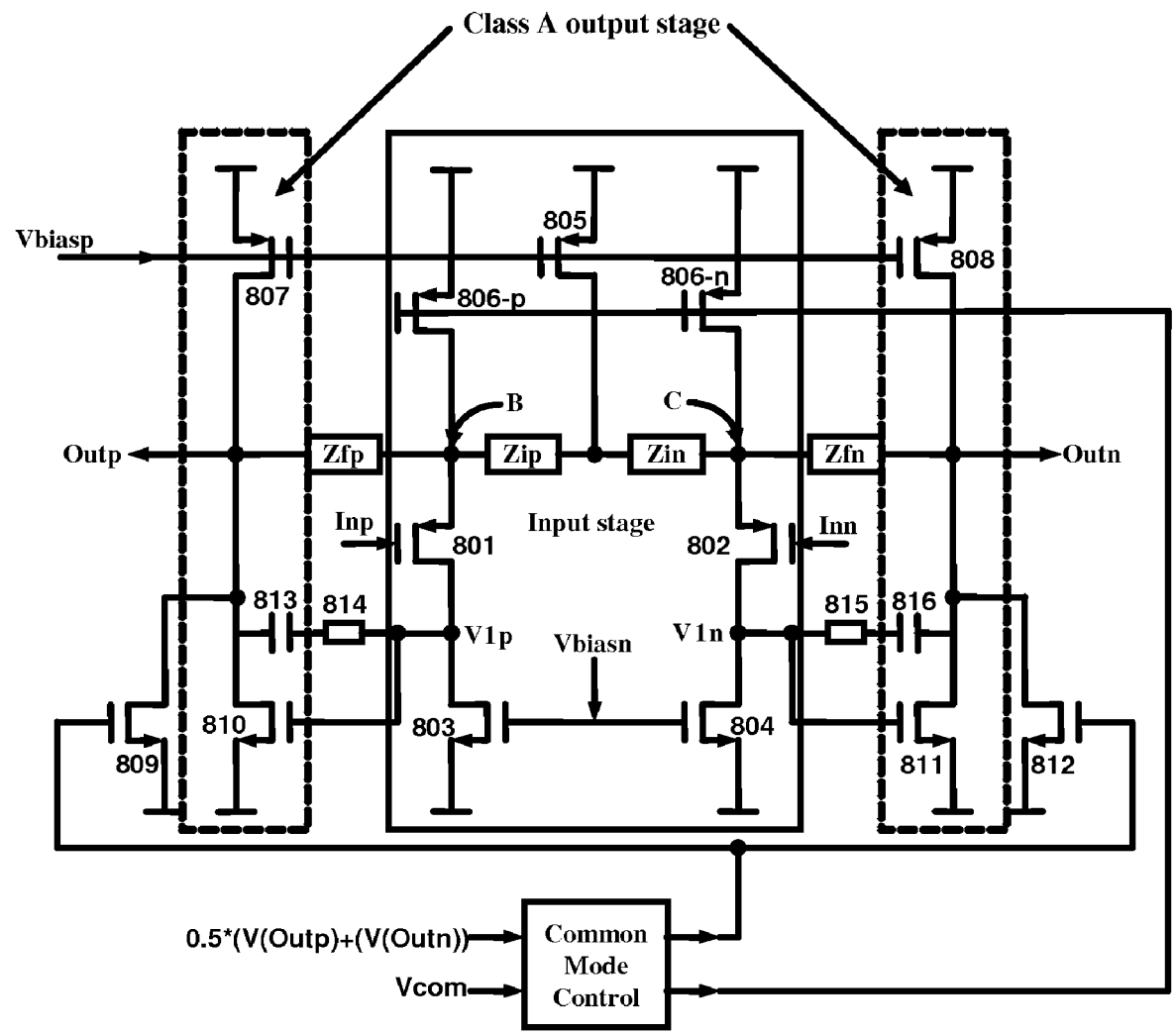
FIG. 8 illustrates a schematic circuit diagram illustrating a different manner of injecting common mode loop current in an amplifier according to the embodiments herein.

(4) Class AB output stage. In FIG. 3(A), there is shown a class A output stage, which can embody other types of architecture such as class AB output stages, which is illustrated in FIGS. 5(A) and 7. The amplifier illustrated in FIG. 7 comprises input transistors 701,702; transistors 703, 704 that serve as the active load for the input stage; an input stage bias transistor 705; a common mode feedback transistor 706 for the input stage; bias transistors 708, 709, 713, 714 for the class AB floating diode stage; class AB floating diode transistors 717, 718, 719, 720; output stage gain transistors 707, 710, 712, 715; common mode feedback transistors 711, 716 for the output stage; Miller compensation capacitors 721, 724, 725, 728; and zero canceling resistors/transistors 722, 723, 726, 727 that improve stability.

(5) Different position to inject common mode current. If a common mode loop is required, there are different points to inject the common mode current and it will yield different advantages. For the scheme that injects common mode current at point A (FIGS. 3(A) and 3(C)), the advantage is the common mode current noise appears as a common mode disturbance and does not degrade the circuit noise performance. For the scheme that injects current at points B and C (FIG. 8), the advantage is there are less headroom concerns. The amplifier shown in FIG. 8 includes input transistors 801, 802; transistors 803, 804 that serve as the active load for the input stage; an input stage bias transistor 805; common mode feedback transistors 806-p, 806-n for the input stage; output stage bias transistors 807, 808; output stage gain transistors 810, 811; common mode feedback transistors 809, 812 for the output stage; Miller compensation capacitors 813, 816; and zero canceling resistors/transistors 814, 815 that improve stability. (6) More than two stages. The general requirement is that the amplifier has two or more stages. However, more stages may require more complex compensation.

FIG. 9, with reference to FIGS. 3(A) through 8, is a flow diagram illustrating a method of reducing noise and power in a differential two-stage amplifier according to an embodiment herein, wherein the method comprises inputting (901) a signal; supplying (903) a capacitive load to an electrical element requiring the capacitive load using exactly one pair of input devices, wherein the pair of input devices are adapted to act as a voltage source follower; transmitting (905) the capacitive load from the pair of input devices to a first resistive element operatively connected to the pair of input devices; transmitting (907) current from the first resistive element to each of a second resistive element and a third resistive element, wherein the second and third resistive elements are sized greater than the first resistive element in order to provide a voltage gain; and using (909) a control feedback loop to place an exact copy of the signal across the first resistive element, wherein the first resistive element is adapted to generate a differential signal current, wherein the control feedback loop is adapted to ensure that the differential signal current goes to the second resistive element to generate a voltage output.

The techniques provided by the embodiments herein may be implemented on an IC chip or using printable electronic technologies (not shown). The chip or printable electronic circuit design is created in a graphical computer programming language, and stored in a computer storage medium (such as a disk, tape, physical hard drive, or virtual hard drive such as in a storage access network). If the designer does not fabricate chips or printable electronic circuits or the photolithographic masks used to fabricate chips or printable electronic circuits, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII or CIF) for the fabrication of photolithographic masks, which typically include multiple copies of the chip design in question that are to be formed on a wafer or printed on a suitable substrate. The photolithographic masks are utilized to define areas of the wafer or printable electronic circuits (and/or the layers thereon) to be etched or otherwise processed or printed.

The resulting integrated circuit chips or printable electronic circuits can be distributed by the fabricator in raw wafer form (that is, as a single wafer that has multiple unpackaged chips), as a bare die, or in a packaged form or as individual printed circuits or in a sheet or roll of printed circuits. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip might then be integrated with other chips, discrete circuit elements, and/or other signal processing devices as part of either (a) an intermediate product, such as a mother or daughter-board, or (b) an end product. The end product can be any product that includes integrated circuit chip or chips and/or printed circuits, ranging from toys and other low-end applications to advanced computer products having a display, a keyboard or other input device, and a central processor.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A low noise, low power differential two-stage amplifier comprising:
    an electrical element;
    exactly one pair of input devices adapted to supply a capacitive load to said electrical element requiring said capacitive load, wherein said pair of input devices are adapted to act as a voltage source follower;
    a first resistive element operatively connected to said pair of input devices and adapted to receive said capacitive load from said pair of input devices;
    a second resistive element adapted to receive current from said first resistive element;
    a third resistive element adapted to receive current from said first resistive element, wherein the second and third resistive elements are sized differently than said first resistive element in order to provide a voltage gain;
    a feedback loop operatively connected to said electrical element and the resistive elements; and
    a gain transistor adapted to sense and increase a loop gain of said feedback loop while said feedback loop is closed.

2. The amplifier of claim 1, wherein said gain transistor comprises a Class A output stage.

3. The amplifier of claim 1, wherein said gain transistor comprises a Class AB output stage.

4. The amplifier of claim 1, further comprising a compensation network comprising a capacitor.

5. The amplifier of claim 4, further comprising a resistor in series with said capacitor.

6. The amplifier of claim 4, further comprising a transistor in series with said capacitor.

7. The amplifier of claim 1, wherein the devices adapted to provide a capacitive load comprises any of a pair of transistors, a pair of resistors, a resistor degenerated metal oxide semiconductor (MOS) device, and a dual NMOS and PMOS device.

8. The amplifier of claim 1, wherein said feedback loop comprises a common mode load feedback circuit operatively connected to at least one of the input devices.

9. A low noise, low power differential amplifier comprising:
    a first stage comprising a pair of electrical devices that sense an input signal difference across said pair of electrical devices; and
    a control feedback loop operatively connected to said first stage, wherein said first stage in combination with said control loop feedback is adapted to place an exact copy of said signal across a first pair of resistive components, wherein said first pair of resistive components are adapted to generate a differential signal current, wherein said control feedback loop is adapted to ensure that said differential signal current goes to a second pair of resistive components to generate a voltage output, and wherein said control loop feedback comprises a common mode loop.

10. The amplifier of claim 9, wherein the first and second pair of resistive components are in ratio to produce said exact copy of said signal with some gain at an output of said first stage.

11. The amplifier of claim 9, further comprising at least one additional stage operatively connected to said first stage.

12. A method of reducing noise and power in a differential two-stage amplifier, said method comprising:
    inputting a signal;
    supplying a capacitive load to an electrical element requiring said capacitive load using exactly one pair of input devices, wherein said pair of input devices are adapted to act as a voltage source follower;
    transmitting said capacitive load from said pair of input devices to a first resistive element operatively connected to said pair of input devices;
    transmitting current from said first resistive element to each of a second resistive element and a third resistive element, wherein the second and third resistive elements are sized greater than said first resistive element in order to provide a voltage gain; and using a control feedback loop to place an exact copy of said signal across said first resistive element, wherein said first resistive element is adapted to generate a differential signal current, wherein said control feedback loop is adapted to ensure that said differential signal current goes to said second resistive element to generate a voltage output.

13. The method of claim 12, further comprising using a gain transistor to sense and increase a loop gain of said control feedback loop while said control feedback loop is closed.

14. The method of claim 13, wherein said gain transistor comprises a Class A output stage.

15. The method of claim 13, wherein said gain transistor comprises a Class AB output stage.

16. The method of claim 12, further comprising configuring a compensation network comprising a capacitor in the amplifier.

17. The method of claim 16, further comprising configuring a resistor in series with said capacitor.

18. The method of claim 16, further comprising configuring a transistor in series with said capacitor.

19. The method of claim 12, wherein the devices adapted to provide a capacitive load comprises any of a pair of transistors, a pair of resistors, a resistor degenerated metal oxide semiconductor (MOS) device, and a dual NMOS and PMOS device.

20. The method of claim 12, wherein said control loop feedback comprises a common mode loop.

* * * * *